United States Patent
Maneatis

(10) Patent No.: US 6,710,665 B2
(45) Date of Patent: Mar. 23, 2004

(54) PHASE-LOCKED LOOP WITH CONDITIONED CHARGE PUMP OUTPUT

(75) Inventor: John George Maneatis, Redwood City, CA (US)

(73) Assignee: True Circuits, Inc., Los Altos, CA (US)

(*) Notice: Subject to any disclaimer, the term of this patent is extended or adjusted under 35 U.S.C. 154(b) by 33 days.

(21) Appl. No.: 10/059,945

(22) Filed: Jan. 28, 2002

(65) Prior Publication Data

US 2002/0101289 A1 Aug. 1, 2002

Related U.S. Application Data

(60) Provisional application No. 60/316,702, filed on Aug. 31, 2001, provisional application No. 60/316,703, filed on Aug. 31, 2001, provisional application No. 60/266,009, filed on Feb. 2, 2001, provisional application No. 60/264,563, filed on Jan. 26, 2001, and provisional application No. 60/264,628, filed on Jan. 26, 2001.

(51) Int. Cl.[7] .................................................. H03L 7/00
(52) U.S. Cl. .............................. 331/17; 331/16; 331/18; 331/55; 331/185
(58) Field of Search ........................... 331/16, 17, 185, 331/18, 55, 56

(56) References Cited

U.S. PATENT DOCUMENTS

| | | |
|---|---|---|
| 4,608,530 A | 8/1986 | Bacrania |
| 4,644,536 A | 2/1987 | Utsumi |
| 4,792,768 A | 12/1988 | Fried et al. |
| 5,043,677 A | 8/1991 | Tomassetti et al. |
| 5,375,148 A | 12/1994 | Parker et al. |
| 5,512,816 A | 4/1996 | Lambert |
| 5,491,439 A | 7/1996 | Kelkar et al. |
| 5,727,037 A | 3/1998 | Maneatis |
| 5,731,696 A | 3/1998 | Pennisi et al. |
| 5,757,238 A | 5/1998 | Ferraiolo et al. |
| 5,783,972 A | 7/1998 | Nishikawa |
| 5,818,287 A | 10/1998 | Chow |
| 5,900,784 A | 5/1999 | O'Sullivan |
| 5,986,485 A | 11/1999 | O'Sullivan |
| 6,043,695 A | 3/2000 | O'Sullivan |
| 6,111,470 A | 8/2000 | Dufour |
| 6,130,561 A | 10/2000 | Dufour |
| 6,201,380 B1 | 3/2001 | Tsujino et al. |
| 6,215,361 B1 | 4/2001 | Lebouleux et al. |
| 6,226,339 B1 | 5/2001 | Nam et al. |
| 6,229,361 B1 | 5/2001 | Henwood |
| 6,242,897 B1 | 6/2001 | Savage et al. |
| 6,249,685 B1 | 6/2001 | Sharaf et al. |
| 6,262,610 B1 | 7/2001 | Lo et al. |
| 6,265,859 B1 | 7/2001 | Datar et al. |
| 6,308,049 B1 | 10/2001 | Bellaouar et al. |
| 6,313,707 B1 | 11/2001 | Fischer et al. |
| 6,317,476 B1 | 11/2001 | Oishi et al. |
| 6,329,882 B1 | 12/2001 | Fayneh et al. |
| 6,566,970 B2 * | 5/2003 | Ingino, Jr. .................. 331/17 |

FOREIGN PATENT DOCUMENTS

JP  2002217721  *  8/2002

OTHER PUBLICATIONS

Delmot et al. "A Fully–Configurable GSM BTS Controller and GMSK–EDGE Baseband Transmitter IC" IEEE Solid–State Conference Feb. 5–7, 2001 pp. 352–353.*

* cited by examiner

Primary Examiner—Michael B Shingleton
(74) Attorney, Agent, or Firm—Kolisch Hartwell, P.C.

(57) ABSTRACT

A phase-locked loop system configured to cause an output signal to tend toward a desired output frequency. The phase-locked loop system includes a charge pump system and an oscillator operatively coupled with the charge pump system. The charge pump system is configured to selectively effect proportional control over the output signal by producing a correcting pulse having a duration and applying the correcting pulse to a proportional control path of the phase-locked loop system. The charge pump system includes a correcting circuit configured to store a correcting charge corresponding to the correcting pulse, and then output the correcting charge over a period of time that is greater than the duration of the correcting pulse. Other configurations of the phase-locked loop system employ programmable current mirrors, and other structures and methods, to reduce charge pump current within the phase-locked loop.

46 Claims, 12 Drawing Sheets

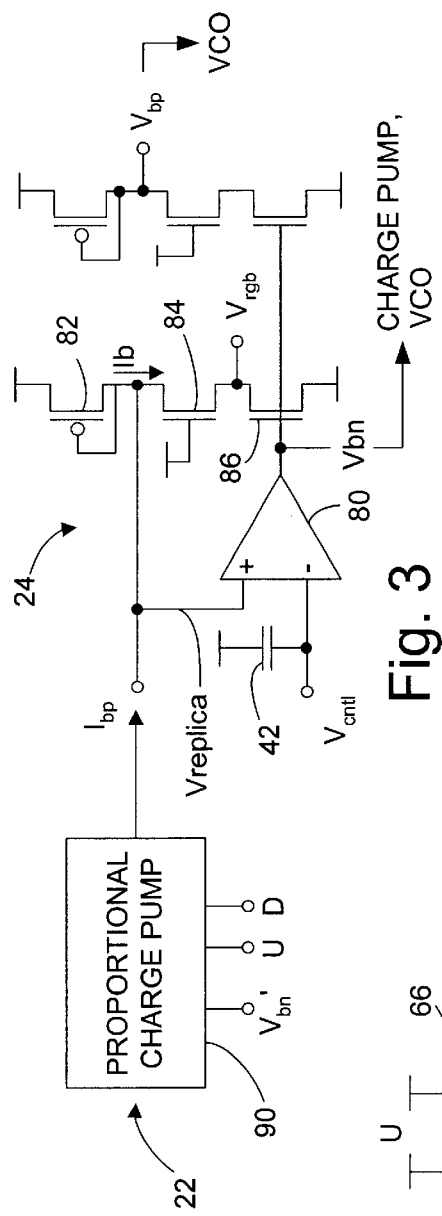
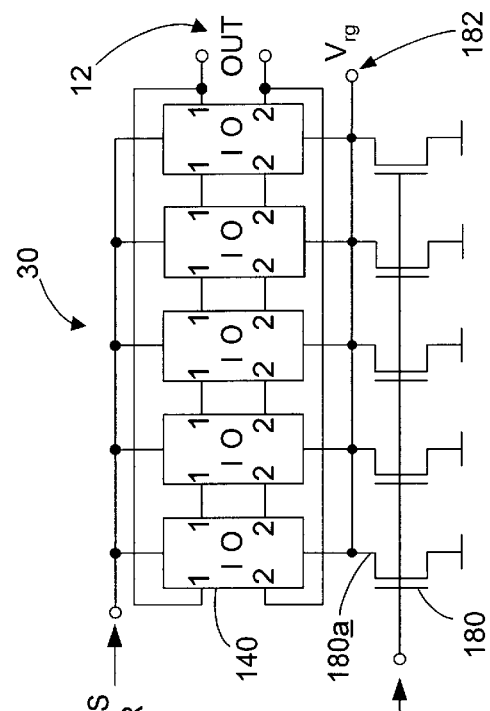
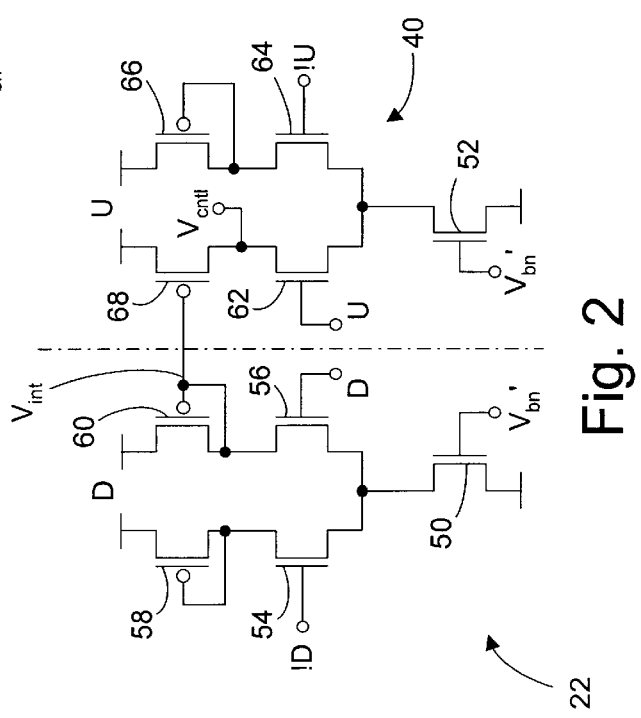

PHASE-LOCKED LOOP WITH CONDITIONED CHARGE PUMP OUTPUT

CROSS-REFERENCE TO RELATED APPLICATION

This application is based upon and claims priority under 35 U.S.C. §119 from the following co-pending U.S. provisional patent applications, each of which is incorporated herein by this reference, in its entirety and for all purposes: "Single-ended Zero Static Phase Offset Phase Locked Loops," Serial No. 60/264,563, filed Jan. 26, 2001; "Multistage Programmable Current Mirrors," Serial No. 60/264,628, filed Jan. 26, 2001; "Single-ended Zero Static Phase Offset Phase Locked Loops," Serial No. 60/266,009, filed Feb. 2, 2001; "Pseudo-differential Zero Static Phase Offset Phase Locked Loops," Serial No. 60/316,702, filed Aug. 31, 2001; and "Multistage Programmable Current Mirrors," Serial No. 60/316,703, filed Aug. 31, 2001.

TECHNICAL FIELD

The present invention relates to phase-locked loop systems, and more particularly to phase-locked loop systems where charge pump output is conditioned in the proportional control path of the loop to improve jitter performance, and/or where the charge pump currents are scaled to vary performance of the phase-locked loop.

BACKGROUND OF THE INVENTION

Phase-locked loop (PLL) systems are used extensively in analog and digital circuits. These systems typically include a phase frequency detector (PFD), charge pump and voltage controlled oscillator (VCO) connected in a feedback configuration. The VCO produces the output signal of the PLL, and the various components of the PLL cooperate to cause the output signal to tend toward and eventually lock on to a desired output frequency, which is based on a reference signal applied as an input to the PFD. For example, many PLL systems are configured to produce an output signal having the same frequency as the input signal, or having an output frequency which is a factor x/y of the input frequency.

The output signal tracks the desired output frequency through operation of a feedback mechanism, in which the output of the VCO is fed back to the PFD as a feedback signal via a feedback path. The phase frequency detector receives the reference signal and the feedback signal, and produces an error signal based on discrepancies between the actual phase and frequency of the output signal and the desired phase and frequency. The error signals from the PFD are applied to the charge pump, which in turn produces signals that control the oscillation frequency of the VCO.

Minimizing or reducing uncontrolled jitter in the output signal is an important design issue in PLL systems. Jitter is variation in the phase and/or frequency of the output signal when the system is aligned or very nearly aligned. Most PLL systems exhibit some amount of jitter in the output signal. Indeed, many PLL systems have what is known as a "dead band," or a range of output alignments through which the system exerts little or no control over the output signal. This problem is addressed in some designs through phase frequency detectors configured to generate simultaneous canceling error signals when the system is in lock. Despite this solution, many of these systems still exhibit an unacceptably high level of jitter, particularly where the systems are used to multiply the frequency of the reference signal. Also, even where jitter is reduced to an acceptable level, many such systems exhibit an undesirable amount of static phase offset in the output signal, that is, an average phase discrepancy between the output signal and the desired phase.

In addition to the above problems, many existing PLL systems have other shortcomings which can have undesirable affects on the PLL output signal. For example, some systems suffer from undesired signal coupling between the various PLL components, which can lead to noise or jitter in the output signal. In other designs, the VCO and other PLL components are susceptible to voltage variations or noise coupled into the system from the voltage supply or other sources.

In addition, conventional phase-locked loops typically include components designed to operate under fixed or relatively fixed conditions. This can reduce the flexibility of the design, and constrain its use to a limited range of applications. For example, many PLL systems are designed for frequency multiplication by a predetermined scale factor, or are designed with predetermined dynamic characteristics (e.g., damping and bandwidth response) that are fixed at design time.

SUMMARY OF THE INVENTION

The present invention provides a phase-locked loop system configured to cause an output signal to tend toward a desired output frequency. The phase-locked loop system includes a charge pump system configured to produce a charge pump output based on differences detected between the output signal and the desired output frequency. The phase-locked loop further includes an oscillator operatively coupled with the charge pump system and configured to produce the output signal based on the charge pump output. The charge pump system is configured to selectively effect proportional control over the output signal by producing a correcting pulse having a duration and applying the correcting pulse to a proportional control path of the phase-locked loop system. The charge pump system also includes a correcting circuit configured to store a correcting charge corresponding to the correcting pulse, and then output the correcting charge over a period of time that is greater than the duration of the correcting pulse.

According to another aspect of the invention, a method is provided for reducing jitter in a phase-locked loop system. The method includes receiving a correcting pulse, storing a charge based on the correcting pulse, and outputting the stored charge over a period of time that is greater than the duration of the correcting pulse.

According to further aspects of the invention, phase-locked loops are provided that employ programmable current mirrors, and other structures and methods, to reduce charge pump current within the phase-locked loop.

BRIEF DESCRIPTION OF THE DRAWINGS

FIG. 2 depicts a charge pump that may be implemented with the system of FIG. 1.

FIG. 3 depicts a charge pump and bias generator that may be implemented with the system of FIG. 1.

FIG. 4 depicts a multistage voltage controlled oscillator that may be implemented with the system of FIG. 1.

DETAILED DESCRIPTION OF THE INVENTION

Figure 1:
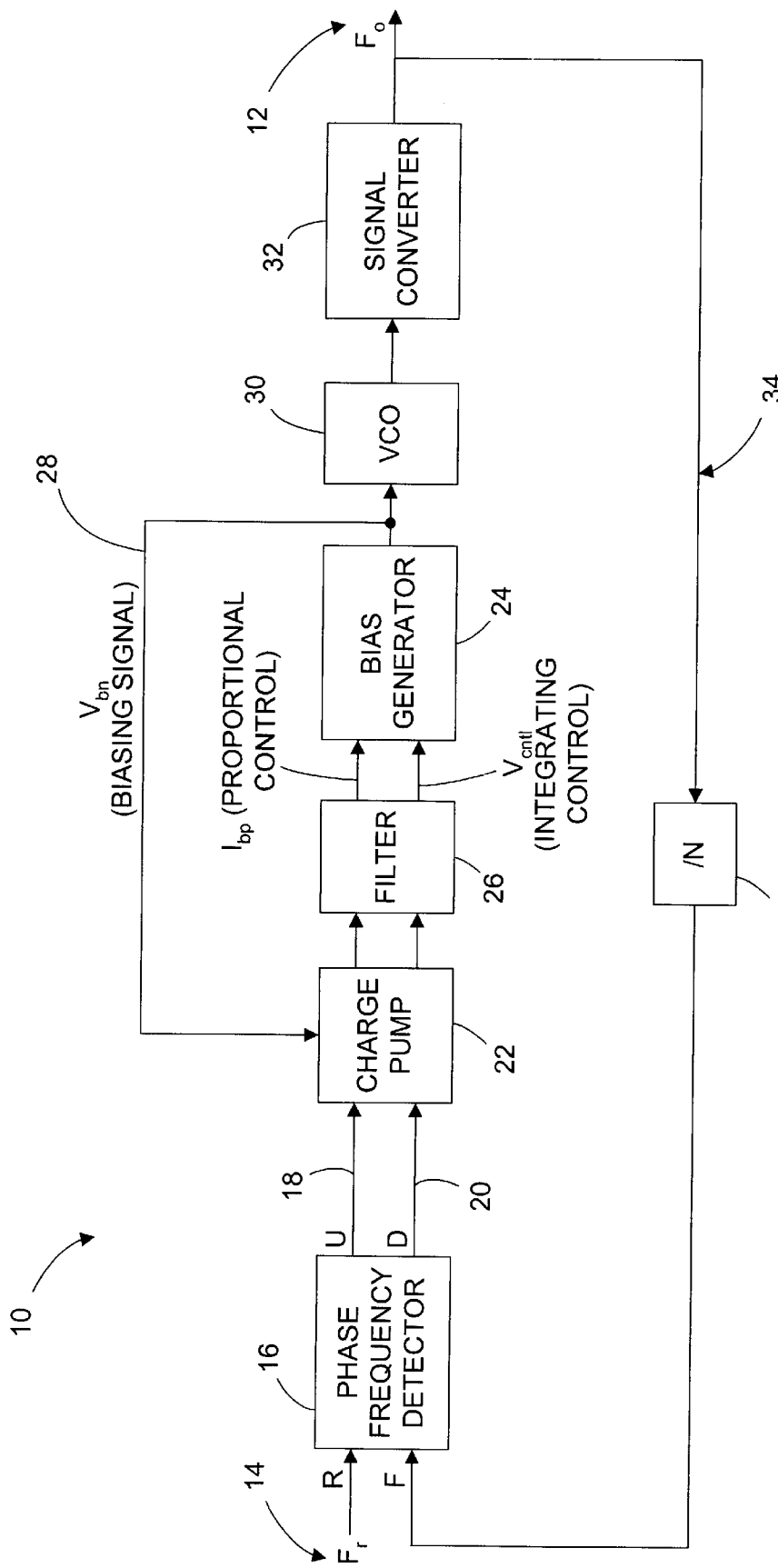
FIG. 1 is a block diagram of a phase-locked loop system according to the invention.

A phase-locked loop (PLL) system is depicted generally at 10 in FIG. 1. PLL system 10 is configured to produce an output signal 12 ($F_o$) in response to application of a reference signal 14 ($F_r$), such that the output signal tends toward a desired output frequency which is based on reference signal 14. For example, the output signal may have the same frequency as the input reference signal, or the output frequency may be a rational factor x/y of the reference frequency.

As indicated, PLL system 10 operates via a feedback arrangement, where output signal 12 is fed back and applied as a feedback input F to an error detector. The present invention will be described primarily in the context of phase-locked loops which implement the error detector as a phase frequency detector (PFD) 16. It will be appreciated, however, that the present invention is applicable to a wide variety of settings where error detection and feedback mechanisms are employed to cause an output signal to have a desired characteristic. For example, other types of error detectors with which the present invention may be used include XOR devices, mixers, edge-triggered latches and sampling flip-flops.

Still referring to FIG. 1, PFD 16 also receives reference signal 14 as a reference input R. PFD 16 detects phase/frequency differences between the signals applied to the reference and feedback inputs, and produces one or more outputs based on the detected differences. Typically, as indicated, the PFD output will take the form of a "U" signal 18, a "D" signal 20, or a combination of those signals. PFD 16 produces the U signal where the actual, or instantaneous, output frequency is lower than the desired output frequency, and/or where the output signal lags the desired output in phase. The D signal is produced where the actual output frequency is higher than the desired output frequency, and/or where the output signal leads the desired output in phase.

PLL system 10 typically also includes a charge pump system 22, bias generator 24 and one or more filters such as low pass filter 26. These components respond to the U and D signals to produce a control signal 28 ($V_{bn}$) that is applied to control a voltage controlled oscillator (VCO) 30. $V_{bn}$ may also be referred to as a biasing signal, because it typically is used to control various current sources and other components in the phase-locked loops of the present invention. For example, as depicted, $V_{bn}$ may be fed back to charge pump system 22 to dynamically bias operation of the charge pump, as will be explained in more detail. Based on application of biasing signal $V_{bn}$, VCO 30 produces output signal 12, either directly or with subsequent processing by signal converter 32 or other components.

For example, in an implementation where output signal 12 ($F_o$) is to track reference signal 14 ($F_r$) without frequency multiplication or division, assume at a given instant that output signal 12 has a lower frequency than the applied reference signal 14. PFD 16 detects this difference and responds by producing one or more U pulses 18. The U pulses then cause a change in biasing signal 28 (resulting, for example, in an increase in current supplied to VCO 30) that produces an increase in the phase and/or frequency of the VCO output signal $F_o$. The charge pump continues to output U pulses until the output frequency equals the reference frequency.

As indicated, output signal 12 may undergo various processing within feedback path 34 before being applied as the feedback input to PFD 16. For example, in PLL applications where the reference frequency is multiplied by a factor to produce the output frequency, the feedback path typically will include a divider 36 and/or other components. Co-pending U.S. patent application Ser. No. 10/059,912, by John G. Maneatis, entitled "Phase-Locked Loop with Composite Feedback Signal Formed From Phase-Shifted Variants of Output Signal," filed on Jan. 28, 2002, provides additional examples of feedback processing and other components and features that may be implemented with the present invention. Co-pending U.S. patent application Ser. No. 10/059,503, by John G. Maneatis, entitled "Self-Biasing Phase-Locked Loop System," filed on Jan. 28, 2002, provides additional examples of PLL systems and components that may be implemented with the present invention. The disclosures of those patent applications are incorporated herein by this reference, in their entirety and for all purposes.

FIGS. 2, 3 and 4 respectively depict in further detail charge pump system 22, bias generator 24 and VCO 30 according to the present invention. Charge pump system 22 typically includes an integrating charge pump 40 configured to provide output to the $V_{cntl}$ node of bias generator 24 in response to error signals received from PFD 16 (i.e., U and/or D pulses). The level of $V_{cntl}$ is maintained at the input of bias generator 24 via capacitor 42. Charge pump 40 causes the $V_{cntl}$ level to increase, decrease or remain constant based on the U and D signals applied from PFD 16. Based on $V_{cntl}$, bias generator 24 produces biasing signal $V_{bn}$, which is applied to the current sources that drive charge pump 40 and VCO 30. At charge pump 40, biasing signal $V_{bn}$ essentially controls the sensitivity of the charge pump to the U and D signals. In other words, the biasing signal controls the extent to which application of these signals causes the $V_{cntl}$ output to vary. At VCO 30, biasing signal $V_{bn}$ acts as the primary input to the oscillator, and controls its output frequency.

As seen in FIGS. 1 and 2, PFD 16 typically includes separate output lines for the U and D signals. Accordingly, charge pump 40 may include a U portion and a D portion configured to receive the corresponding error signals from the PFD. Each portion contains one or more current paths which are controlled by biasing signal $V_{bn}$ and through application of the error signals received from PFD 16. The currents flowing through the paths create various node voltages which ultimately determine the behavior of the control signal $V_{cntl}$.

Referring particularly to FIG. 2, transistors 50 and 52 act as current sources. These transistors are biased by $V_{bn}'$, a mirrored copy of biasing signal $V_{bn}$, as will be explained below. Transistors 54 and 56 steer current into one of two diode-connected transistors 58 and 60, and transistors 62 and 64 steer a matched current into the depicted $V_{cntl}$ terminal, or into diode-connected transistor 66. The current mirror formed by transistors 60 and 68 sources as much charge into $V_{cntl}$ as is drained through transistor 60, subject to certain limitations discussed below. Because transistors 54, 56, 62 and 64 control activation of the various current paths within the charge pump in response to the U and D error signals, those transistors may be collectively referred to as a switching device.

From the above, it should be understood that application of the U signal from PFD 16 causes $V_{cntl}$ to fall, while application of the D signal causes $V_{cntl}$ to rise. As will be explained in more detail, decreases in $V_{cntl}$ produce an increase in biasing signal $V_{bn}$ and an increased bias current $I_b$ within bias generator 24 (FIG. 3). The increase in biasing signal $V_{bn}$ causes the current supplied to VCO 30 to rise. This increased VCO current produces positive phase and/or frequency adjustments to output signal 12. Conversely, when $V_{cntl}$ increases (e.g. from pulsing of the D signal), the bias current $I_b$ and biasing signal $V_{bn}$ drop. This decreases the current supplied to VCO 30, which in turn produces negative adjustment to the phase and/or frequency of output signal 12.

In typical implementations of the present invention, the error signals output by PFD 16 tend to have a stabilizing effect upon the output signal when the system is in lock. Conversely, in the absence of either a U or a D signal (as might occur if little or no discrepancy were detected between the two signals applied to the inputs of PFD 16), output signal 12 tends to drift about the desired output frequency instead of achieving a stable lock. The range of alignments in which this drift effect occurs is known as a "dead band." The dead band results partly from the narrowing of the U and D pulses as the system approaches lock. Narrower pulses are often filtered out by various components in the system, such that the system is unable to correct discrepancies between the output signal and the desired output frequency until those discrepancies exceed some threshold magnitude. The resulting output jitter is often undesirable.

To eliminate or reduce this undesired jitter in the output signal, PFD 16 may be configured to emit both U and D pulses when the PFD inputs are aligned or nearly aligned. When only one of the signals is applied, charge pump system 22 pumps a net charge to bias generator 24, in order to produce variation in the phase and/or frequency of the output signal. By contrast, where both the U and D signals are applied together (simultaneously) to charge pump 40, the charge pump should pump no net charge.

Typically, when U and D are pulsed simultaneously to avoid a dead band, the respective effects of those error signals are at least partially canceled via operation of the current mirror defined by transistors 60 and 68 (FIG. 2). Theoretically, the current mirror ensures that the current through transistors 60 and 68 will be equal, leaving no net output charge from charge pump 40, and ensuring no variation of the $V_{cntl}$ level on capacitor 42. If a net charge were pumped in such a situation, the variation in $V_{cntl}$ would introduce an undesired variation in output signal 12. Specifically, such charge leakage can produce undesired static phase offset in output signal 12.

The current through transistors 60 and 68 would be equal if charge pump 40 contained an ideal current mirror and two ideal switchable current sources with infinite output impedance. However, these devices typically are not ideal in practice, and the phase-locked loops described herein normally include some mechanism to force the voltage $V_{cntl}$ to equal the $V_{int}$ gate voltage on transistor 60. This causes the charge pump output current to be zero when U and D are asserted, leaving no net effect upon the $V_{cntl}$ voltage stored on capacitor 42.

Bias generator 24 dynamically varies its output biasing signal $V_{bn}$ in order to balance the charge pump output when U and D signals are simultaneously applied to charge pump 40. As the current being steered through transistor 60 grows larger, the voltage on $V_{int}$ grows smaller. Bias generator 24 is configured to find and supply a $V_{bn}$ level for which the voltage $V_{int}$ will equal the voltage $V_{cntl}$. Bias generator 24 contains an amplifier 80 and a replica of the current path through the D side of charge pump 40 when the D signal is pulsed. The replica current path includes transistors 82, 84 and 86. The negative feedback through the amplifier causes $V_{replica}$ to be equal to $V_{cntl}$ by appropriately adjusting the biasing current $I_b$ set by $V_{bn}$.

With both U and D high, the activated current path on the left side of the charge pump will look identical to the replica current path within bias generator 24, so that $V_{int}$ will equal $V_{replica}$, which the bias generator forces to equal $V_{cntl}$. The right side of charge pump 24 is similar, but the gate of transistor 68 is not connected to its drain. However, like transistor 60, both the gate and drain voltages will be $V_{cntl}$. Thus, the right side of the charge pump should behave identically to the left side so that the current sourced by transistor 68 will exactly match the current sunk by transistor 62 leaving no net output current.

With no output current from the charge pump when both U and D are high, there should be no net charge output when U and D are pulsed identically, as would occur in a locked condition with zero static phase offset. Phase-locked loops with this arrangement may thus be considered self-biased phase-locked loops.

As should be appreciated from the above discussion, biasing signal $V_{bn}$ is dynamically generated free of any external bias levels. In addition to balancing operation of charge pump system 22, the biasing signal dynamically controls other current sources within phase-locked loop 10. Also, the dynamic operation of bias generator 24 causes the bias generator to maintain a regulated bias generator voltage that is independent of fluctuations in the $V_{dd}$ and $V_{ss}$ supplies. The regulated bias generator voltage is matched to a regulated voltage in VCO 30, which improves supply and substrate noise rejection of the PLL system.

As indicated, bias generator 24 is also configured to produce a secondary biasing signal $V_{bp}$, which may be used to facilitate biasing of the voltage controlled oscillator, as described in detail in above-referenced co-pending U.S. patent application Ser. No. 10/059,503, by John G. Maneatis, entitled "Self-Biasing Phase-Locked Loop System," filed on Jan. 28, 2002.

As indicated above, charge pump system 22 typically includes an integrating charge pump 40 to provide integrating control over output signal 12. In many cases, it will also be desirable to employ proportional control to achieve stable feedback. Accordingly, as seen in FIG. 3, charge pump system 22 may also include a proportional charge pump 90.

Typically, integrating charge pump 40 and proportional charge pump 90 are similar, if not identical, in construction and internal operation. Both pumps respond to the U and D error signals by pumping charge for application to bias generator 24, in order to produce adjustments to output signal 12. Also, both pumps are biased via feedback coupling of biasing signal $V_{bn}$ (or mirrored copy $V_{bn}'$) from bias generator 24.

The two charge pumps are distinguished by the signal path to bias generator 24, and by the way pumped charge is applied to the bias generator. Integrating charge pump 40 pumps its output charge along an integrating control path defined between $V_{cntl}$ node of charge pump 40 and the $V_{cntl}$ input terminal of bias generator 24. The pumped charge is integrated by and stored at capacitor 42. The voltage on this capacitor represents the net accumulated charge resulting from all of the previously applied U and D signals to integrating charge pump 40.

By contrast, proportional charge pump 90 pumps its output charge via a proportional control path to the $V_{replica}$ node of bias generator 24. The output charge typically is in the form of a current pulse $I_{bp}$ which is added to or subtracted from the $I_b$ bias current flowing within the replica current path in bias generator 24. In some cases, there may be various capacitances introduced into the proportional control path, though these capacitances typically are much smaller than capacitor 42. Accordingly, the proportional control provided by charge pump 90 normally involves small phase adjustments to output signal 12, where the integrating control provided by integrating charge pump 40 typically involves more gradual adjustments to the frequency of the output signal, due to the accumulated charge on capacitor 42 and the filtering effects produced by the relatively large capacitance.

Figure 5:
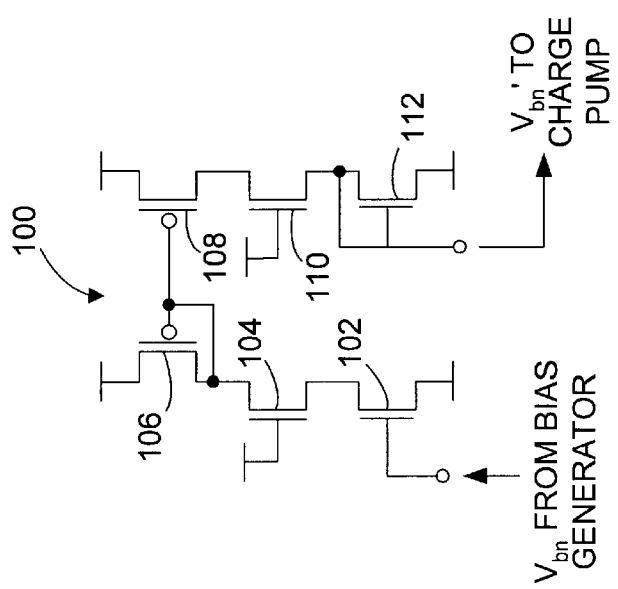
FIG. 5 depicts a circuit that may be implemented to isolate biasing signals within the charge pumps of the present invention.

As indicated above, when phase-locked loop 10 is in lock, PFD 16 emits small, equal-sized U and D pulses to charge pump system 22. These pulses can capacitively couple into biasing signal $V_{bn}$ through transistors 54, 56, 62, 64, 50 and 52 of integrating charge pump 40. Similar signal coupling can occur in proportional charge pump 90. The resulting periodic noise on biasing signal $V_{bn}$, may cause some cycle-to-cycle jitter, since the biasing signal is also used to drive VCO 30. As seen in FIG. 5, the charge pump system may include an isolated bias input path 100 to isolate biasing signal $V_{bn}$ and avoid the jitter described above.

As indicated in FIG. 5, isolated bias path 100 typically includes a number of transistors (e.g., transistors 102, 104, 106, 108, 110 and 112) which define a current mirror system. The current mirror produces a mirrored copy $V_{bn}'$ of the $V_{bn}$ biasing signal generated by bias generator 24. The mirrored biasing signal $V_{bn}'$ is then used in the charge pumps, so that noise coupled onto it does not affect VCO 30. The left transistor stack essentially creates a local copy of the secondary biasing signal $V_{bp}$ generated by bias generator 24. In some settings, it may be desirable to directly use the secondary biasing signal in the right transistor stack, instead of generating a local copy.

Co-pending U.S. patent application Ser. No. 10/059,912, by John G. Maneatis, entitled "Programmable Current Mirror," filed on Jan. 28, 2002, provides additional examples of current mirroring devices that may be employed with the present invention. The disclosure of that application is incorporated herein by this reference, in its entirety and for all purposes.

As discussed above, bias generator 24 includes a feedback loop that actively tracks $V_{cntl}$ to generate a dynamic biasing signal which controls both the charge pump system 22 and VCO 30. For reasons explained below, it typically is important that this feedback loop exhibit a bandwidth response that is much faster than the overall bandwidth of the PLL system.

However, in some cases it will be desirable to couple components within the proportional control path (e.g., between proportional charge pump 90 and the $V_{replica}$ node of bias generator 24) that may affect the dynamic response of the bias generator feedback loop. Where these components are used, and in other cases, coupling proportional charge pump 90 and these components directly to bias generator 24 can increase the capacitance on $V_{replica}$. Large increases in this capacitance can destabilize the feedback loop within the bias generator. This can be countered with an increase in the capacitance on biasing signal $V_{bn}$, though such an increase would reduce the bandwidth of the bias generator, which in turn can reduce the supply and substrate noise rejection of the VCO, as will be explained below.

Figure 6:
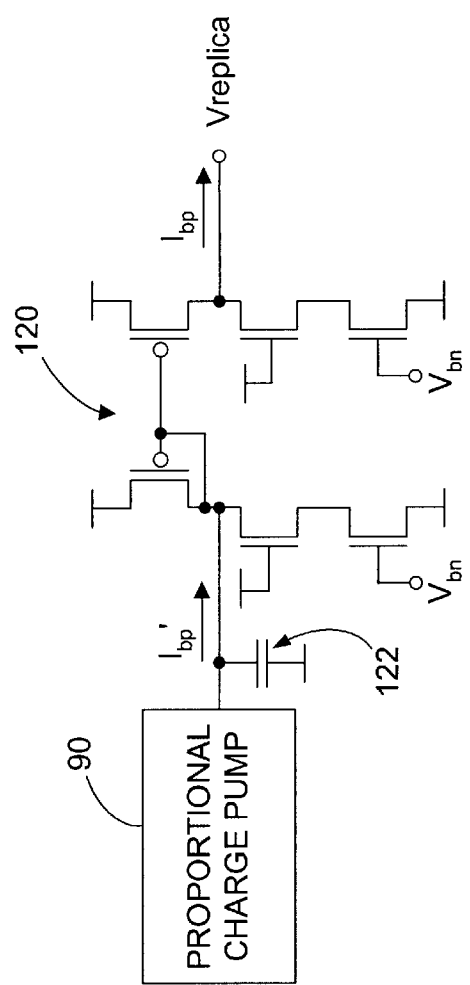
FIG. 6 depicts a current mirror system that may be employed within a proportional control path between the charge pumps and bias generators of the present invention.

These issues may be addressed by providing proportional charge pump 90 with an isolated output 120 within the proportional control path, as seen in FIG. 6. Isolated output 120 includes a number of transistors which define a current mirror system. The current mirror system is pre-biased by biasing signal $V_{bn}$ from bias generator 24, and replicates initial output $I_{bp}'$ (but with opposite sign), so that output $I_{bp}$ is applied to the $V_{replica}$ node of the bias generator, as discussed above with reference to FIG. 3. The U and D inputs may be reversed on the proportional charge pump to compensate for the change in sign. The depicted current mirror system isolates proportional charge pump 90 from bias generator 24. This allows use of an arbitrary capacitance 122, or other components in the proportional control path, without affecting damping, bandwidth or other dynamic characteristics of the feedback loop contained within bias generator 24. Further filtering and signal isolation may be provided by cascading additional stages to the depicted isolation circuit.

As discussed above, the output from charge pump system 22 controls the oscillatory response of voltage controlled oscillator 30, and has various effects upon the overall performance of PLL system 10. For example, the magnitude of the charge pump output currents affects the bandwidth response of the PLL system. In addition, where the charge pump output includes pulsed components (e.g., current pulses), the frequency at which those components are provided to bias generator 24 affects the frequency at which adjustments are made to the PLL output signal (i.e., output signal 12). Accordingly, it will often be desirable to employ additional components to condition the charge pump output and thereby vary its effects upon the performance of the PLL system.

Figure 7:
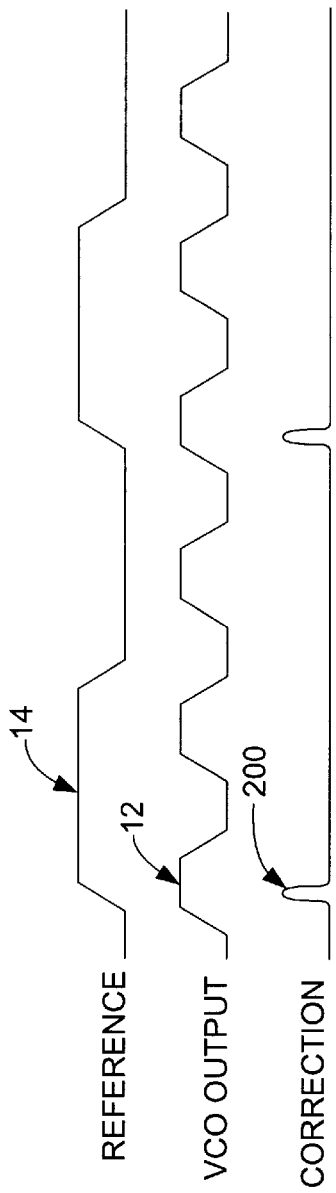
FIG. 7 depicts exemplary waveforms of a reference signal, output signal and correction signal occurring in a frequency-multiplying phase-locked loop.

Conditioning certain components of the charge pump output may be desirable in applications where the PLL system is configured to multiply the reference frequency. FIG. 7 depicts various exemplary waveforms that may occur in a PLL system configured to multiply the reference frequency by an integer value N. Specifically, FIG. 7 depicts several cycles of reference signal 14, and several cycles of VCO output signal 12, where the reference frequency is multiplied by a factor of N=3. As indicated, the phase frequency detector applies a correction signal 200 to the loop once per reference cycle. In typical configurations, this correction signal is a current pulse.

The current $I_{bp}$ generated by proportional charge pump 90 (FIG. 3) and added to the $V_{replica}$ node of bias generator 24 is an example of such a pulsed correction signal. Because proportional charge pump 90 adds the $I_{bp}$ current directly to bias generator 24, only one of every N VCO output cycles is adjusted (e.g., lengthened or shortened) via operation of proportional charge pump 90. This may contribute to jitter in output signal 12.

Proportional charge pump 90 can cause bias generator 24 to generate noise on biasing signal $V_{bn}$ (i.e., the output of bias generator 24), and thus on the VCO output, even when the system is in lock. Assuming a proportional charge pump of similar construction to the integrating charge pump 40 depicted in FIG. 2, this noise may occur where the current pulse mirrored through transistors 60 and 68 is not sourced at the same time as the current pulse through transistor 62. So although the two pulses are equal, and cancel when integrated, they collectively add a small disturbance to the charge pump output, in this case by introducing a disturbance into biasing signal $V_{bn}$, which in turn produces a disturbance in the VCO output.

It will be appreciated that the issues just discussed typically are not as applicable to integrating charge pump 40, since the integrating charge pump produces bursts of current that are integrated by and stored at capacitor 42. Thus, in contrast to the transient output of the proportional charge pump, the integrating output is preserved as a small change in control signal Vcntl which is applied to multiple subsequent VCO output cycles.

The jitter issues discussed above are not confined to PLL systems performing integral frequency multiplication. PLL systems commonly perform rational (i.e., non-integral) frequency multiplication, so as to produce an output frequency which is x/y times the reference frequency. This is typically achieved by dividing the feedback signal by x and the reference signal by y to achieve overall multiplication by x/y. The feedback divider value may changed from one compared edge to the next to achieve higher precision or multiplication by an irrational factor. The jitter problems discussed above can affect such PLL systems even more significantly.

One way of addressing these proportional control issues is to place a capacitor on the output of the proportional charge pump. The size of this capacitor is constrained by the loop bandwidth of the PLL system. Specifically, the pole created by the capacitance must be approximately one decade above the loop bandwidth. Consequently, the lower the loop bandwidth, the better a capacitor on the proportional charge pump can filter out jitter.

Instead of, or in addition to the added capacitance discussed above, the PLL systems of the present invention may be configured to spread correction signals generated by the charge pump system so that those corrections occur over an increased period of time. For example, phase-locked loop 10 may be provided with a circuit intermediate proportional charge pump 90 and bias generator 24 that is configured to store a charge corresponding to the $I_{bp}$ correcting pulses output by the proportional charge pump. The stored charge is then output over a period of time that is greater than the duration of the original correcting pulse received by the circuit. As will be explained in detail below, this may be achieved by converting the correcting pulse into a series of smaller pulses, into a charge-equivalent current, and/or through other methods.

Figure 8:
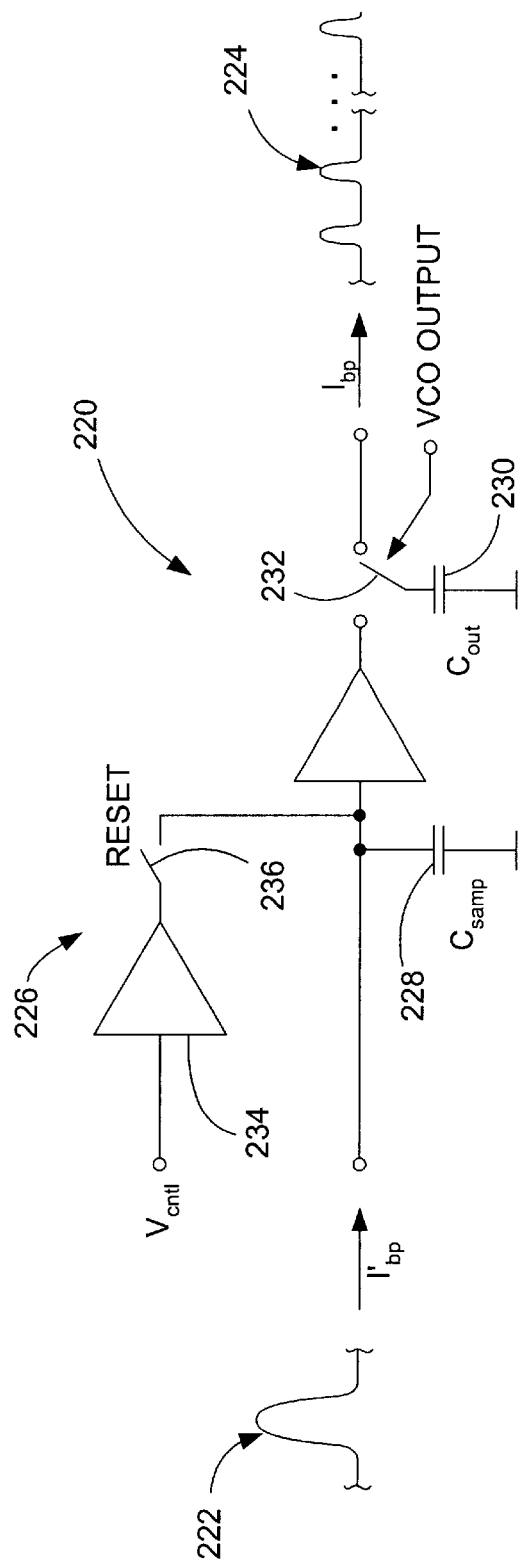
FIG. 8 depicts a circuit according to the present invention that is configured to receive a correcting pulse and output a plurality of smaller correcting pulses within the proportional control path of the system shown in FIG. 1.

FIG. 8 depicts a correction circuit 220 configured to convert $I_{bp}'$ pulses 222 produced by proportional charge pump 90 into a series of smaller $I_{bp}$ pulses 224. The $I_{bp}'$ correcting pulse is the average charge pump current produced over the reference cycle ($T_{ref}$). Circuit 220 is coupled in the proportional control path between proportional charge pump 90 and the $V_{replica}$ node of bias generator 24, and typically includes a reset mechanism 226, sampling capacitor 228 ($C_{samp}$) and output capacitor 230 ($C_{out}$), and output switch 232.

As discussed above, proportional charge pump 90 periodically produces a correcting pulse $I_{bp}'$ to proportionally control voltage controlled oscillator 30. Typically, these correcting pulses occur in a one-to-one relationship with cycles of the reference signal, as seen in FIG. 7. Each reference cycle, sampling capacitor 228 is reset to $V_{cntl}$ (the stored output level of integrating charge pump 40) via operation of reset mechanism 226, which includes a voltage buffer 234 and a reset switch 236. After the reset operation, sampling capacitor 228 receives $I_{bp}'$ correcting pulse 222 and accumulates a corresponding charge. After capacitor 228 is fully charged, the stored charge is repeatedly dumped over to charge output capacitor 230 via operation of output switch 232, which is controlled by VCO output signal 12. The resulting charge on output capacitor 230 dumps directly into bias generator, resulting in application of a series of $I_{bp}$ pulses 224 to the bias generator $V_{replica}$ node for each one of the original correcting pulses 222. In addition, because output switch 232 is timed with VCO output signal 12, one such partial correcting pulse occurs for each cycle of the output signal. Absent operation of circuit 220, corrections are applied to the loop only once every N cycles of the VCO output signal, as seen in FIG. 7. Application of the smaller, higher frequency pulses thus reduces jitter in VCO output signal 12.

In many cases it will be advantageous to ensure that the total output charge from circuit 200 equals the total input charge. If $C_{out}=C_{samp}$ and there are N VCO cycles for each reference cycle, then the total charge transferred into the input of circuit 200 will be the same as the total charge that is applied to the $V_{replica}$ node of bias generator 24.

Figure 10:
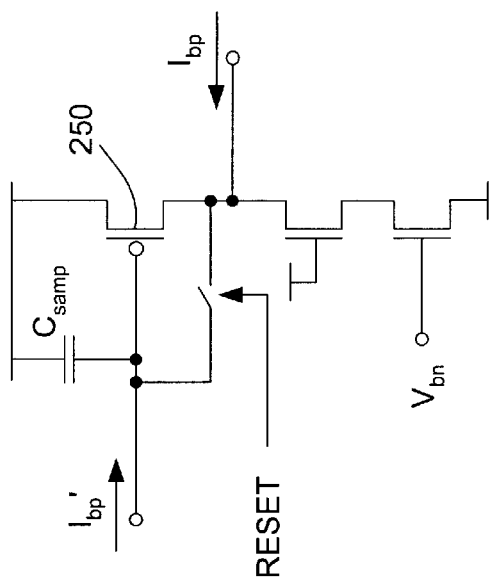
FIG. 10 is a circuit-level representation of the correction system shown in FIG. 9.
Figure 9:
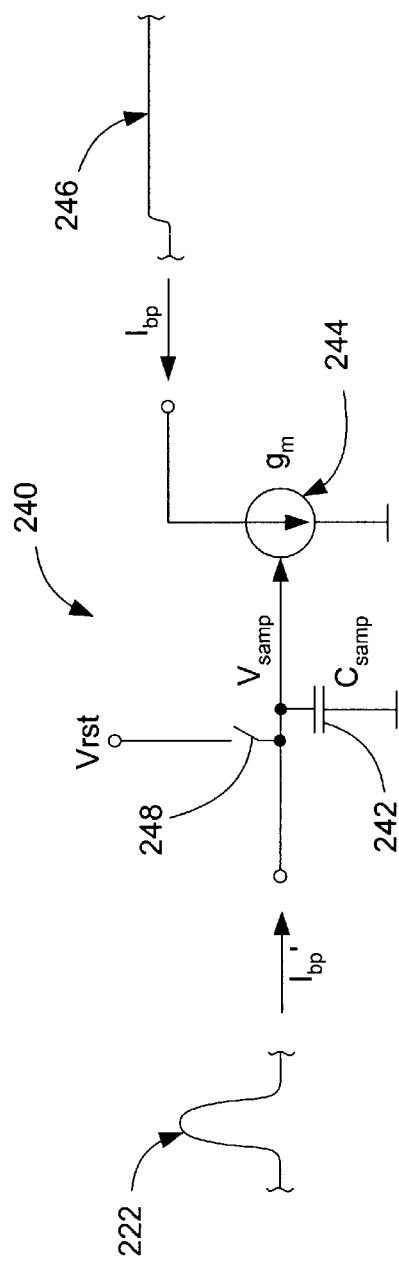
FIG. 9 depicts a correction system according to the present invention that is configured to receive a correcting pulse and output a corresponding charge-equivalent current into the proportional control path of the system shown in FIG. 1.

FIG. 9 schematically depicts another circuit implementation configured to spread corrections generated by proportional charge pump 90 over an increased period of time. Similar to circuit 200, circuit 240 is coupled in the proportional control path between proportional charge pump 90 and bias generator 24. Circuit 240 includes a sampling capacitor 242 configured to integrate correction pulses 222 into a stored charge $Q_{ch}$. The resulting voltage on capacitor 242 is applied to control a voltage controlled current source 244. Current source 244 typically is controlled by the accumulated charge $Q_{ch}$ such that a charge equivalent to that received from the proportional charge pump is output as a correcting current 246 over a period of time that is longer than the duration of the received correcting pulse 222. Reset switch 248 resets the sampling capacitor every reference cycle. FIG. 10 depicts an exemplary circuit-level implementation of the system shown in FIG. 9.

In the systems depicted in FIGS. 9 and 10, $$Q_{ch}=I_{bp}'\cdot T_{ref}$$

and $$V_{samp}=Q_{ch}/C_{samp};$$

and $$I_{bp}=g_m\cdot V_{samp}=g_m\cdot(Q_{ch}/C_{samp})=g_m\cdot(I_{bp}'\cdot T_{ref})/C_{samp}.$$

For a self-biased PLL, as described above, $$T_{ref}=N\cdot(C_b/g_m),$$

where $C_b$ is the total buffer output capacitance for all stages. Also, $$I_{bp}=I_{bp}'\cdot N\cdot(C_b/C_{samp}).$$

To get $I_{bp}=I_{bp}'$, we make $C_{samp}=N\cdot C_b$. This factor of N is generally useful, since the proportional charge pump current typically must be a factor of N larger than the integral charge pump current for stability. Using different $C_b/C_{samp}$ ratios, different effective charge pump currents can be obtained without unbalancing the charge pump structure. The derivations of the above equations are presented in an article by John G. Maneatis appearing in the IEEE Journal of Solid State Circuits, vol. 31, no. 11, pp. 1723–1732, November 1996.

Figure 11:
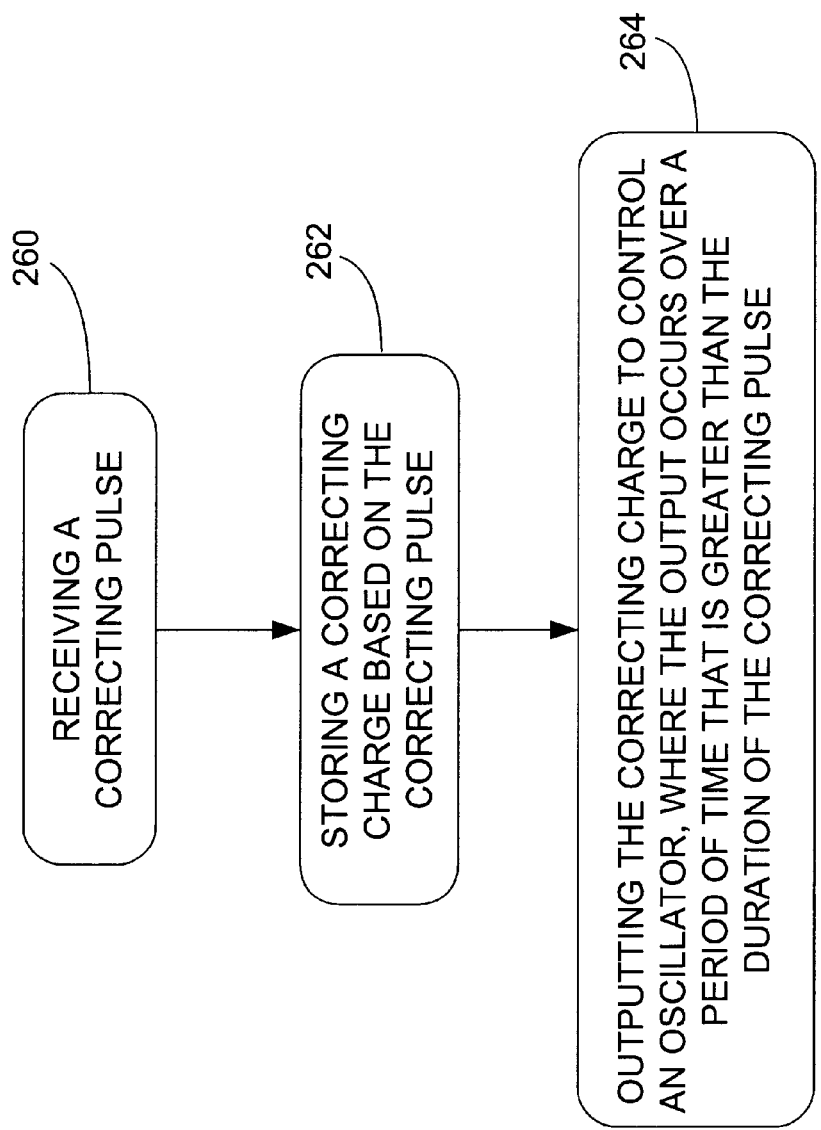
FIG. 11 depicts a method of reducing output jitter in a PLL system according to the present invention.

It will be appreciated that the invention further encompasses a method of reducing jitter in a phase-locked loop system. FIG. 11 depicts an example of such a method. At 260, the method includes receiving a correcting pulse. As indicated in the preceding discussion, this pulse typically is in the form of a pulsed current provided along the proportion control path feeding the $V_{replica}$ node of bias generator 24. At 262, the method further includes storing a charge based on the pulsed correction signal received in step 260. Commonly, this is performed using a sampling capacitor, though other suitable devices and techniques may be used. The stored charge is then output, at 264, over a period of time greater than the duration of the correcting pulse that was received at step 260. As discussed above, this spreading of the correction signal reduces ripple in the proportional control signal, and thus reduces jitter in the output signal of the phase-locked loop system. The output step may be performed by outputting the stored charge as a series of smaller correcting pulses, or by outputting the stored charge as a relatively constant current applied over a longer duration than that of the original correcting pulse.

Figure 12:
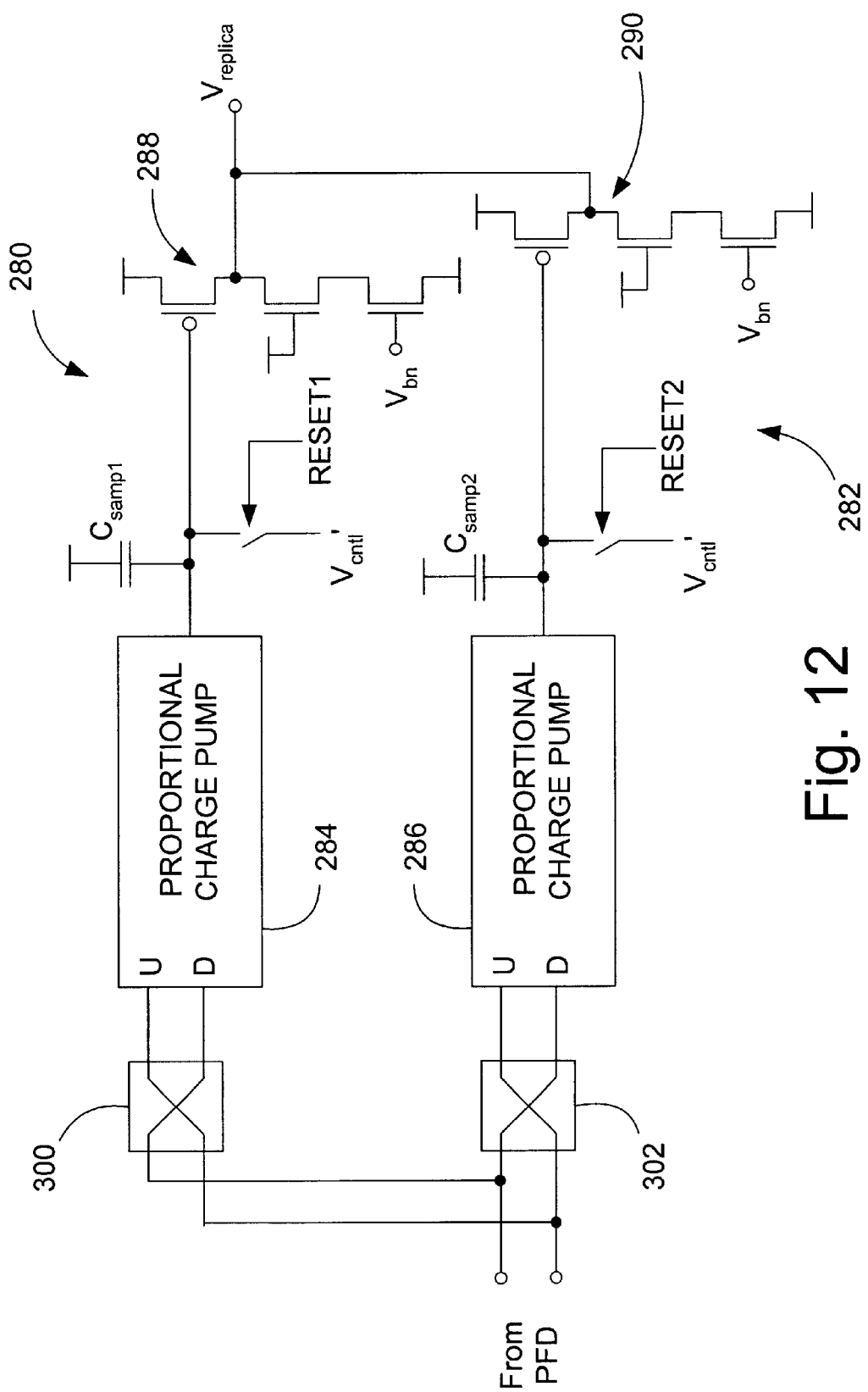
FIG. 12 depicts another embodiment of a proportional control correcting circuit according to the present invention.

Two or more correction circuit stages may be provided in the proportional control path between proportional charge pump 90 and bias generator 24. For example, as seen in FIG. 12, two correction stages 280 and 282 similar to circuit 240 (FIGS. 9 and 10) are coupled in the proportional control path to the outputs of proportional charge pumps 284 and 286. This configuration may be advantageous where the duration of the reset operation discussed above lasts for a large portion of a reference cycle. In the depicted example, correction stages 280 and 282 are arranged in parallel, with the sample/reset operations being respectively controlled by reset signals reset1 and reset2, such that the two correction stages integrate on alternating reference cycles. Accordingly, while one correction stage is integrating, the other is being reset.

This implementation can be further extended to three or more correction stages. Where three correction stages are used, each correction stage may be configured to first reset, then wait for a correcting pulse, and then integrate to accumulate a charge. Performance of these functions is staggered among the three stages, such that at any given time, one stage is resetting, a second is waiting, and the third is outputting its accumulated charge.

In addition, as seen in FIG. 12, the reset switch may be configured to selectively connect capacitor $C_{samp}$ to a $V_{cntl}$ replica voltage, $V_{cntl}'$, instead of being coupled between the gate and drain of transistor 250 (FIG. 10). The circuit depicted in FIG. 12 has two $g_m$ stages (288 and 290) biased by $V_{bn}$ that may be matched to the impedances in voltage controlled oscillator 30 and bias generator 24. Stages 288 and 290 alternately drive a time-averaged proportional control current into the $V_{replica}$ node of bias generator 24.

Figure 13:
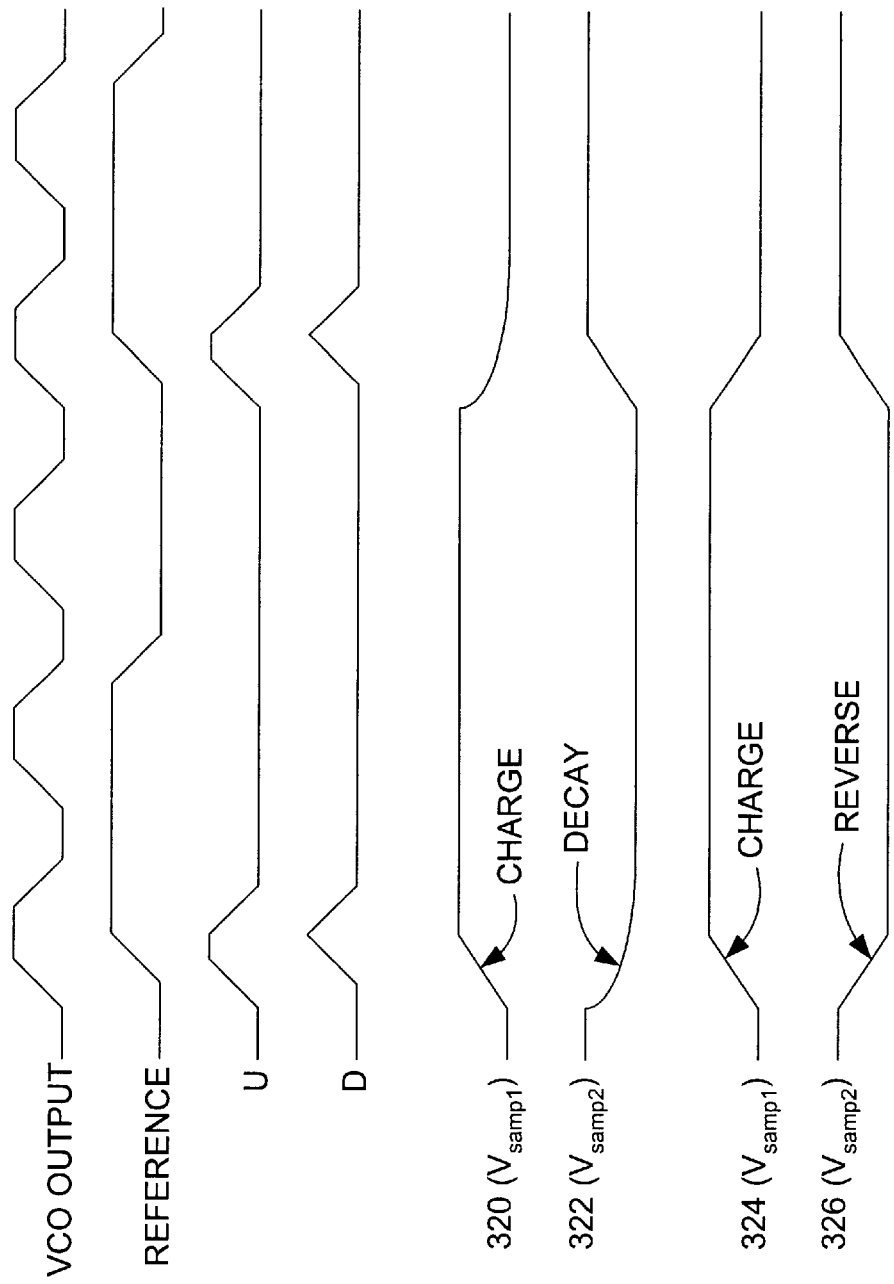
FIG. 13 depicts exemplary sampling waveforms occurring in the correcting circuit shown in FIG. 12.

In the two-stage system shown in FIG. 12, as one sampling capacitor is charged by the charge pump, the other sampling capacitor is reset to $V_{cntl}$ (or the $V_{cntl}'$ replica of $V_{cntl}$) through a switch. It is normally preferable that the these two waveforms perfectly sum to the prior voltage level so that the $I_{bp}$ current is not disturbed between reference cycles with constant size $I_{bp}'$ pulses. However, if the charge pump connected to the resetting sampling capacitor is turned off during reset, then the reset waveform will be an exponential decay as the sampling capacitor discharges. This exponential discharge is different in shape from the charge curve of the active charge pump, as indicated by the $V_{samp1}$ and $V_{samp2}$ voltage plots 320 and 322 shown in FIG. 13.

For many applications, it will be desirable to address this asymmetry by reversing operation of the charge pump connected to the resetting capacitor, instead of turning the charge pump off. As seen in $V_{samp1}$ and $V_{samp2}$ voltage plots 324 and 326, this results in the resetting waveform more nearly matching the sampling waveform so that the waveforms sum to the prior voltage level. As a result, the current injected into $V_{replica}$ by the charge pump system will be more nearly constant.

The charge pump system may be configured in a variety of different ways to cause individual charge pumps to either shut off or pump in reverse. In the depicted exemplary embodiment, this is accomplished via operation of logic networks 300 and 302 (FIG. 12) that receive and process the U and D signals digitally before they enter the charge pump. Specifically, logic networks 300 and 302 are configured to conditionally reverse U and D.

Shorting the sampling capacitors to a $V_{cntl}$ replica $V_{cntl}'$, rather than to $V_{cntl}$ itself avoids disturbing $V_{cntl}$ with bursts of charge. However, these bursts of charge within the proportional control path may be manipulated to provide the same integrating control that is achieved in the previously described embodiments through the pumping of charge from integrating charge pump 40 into capacitor 42 (FIGS. 2 and 3).

Figure 14:
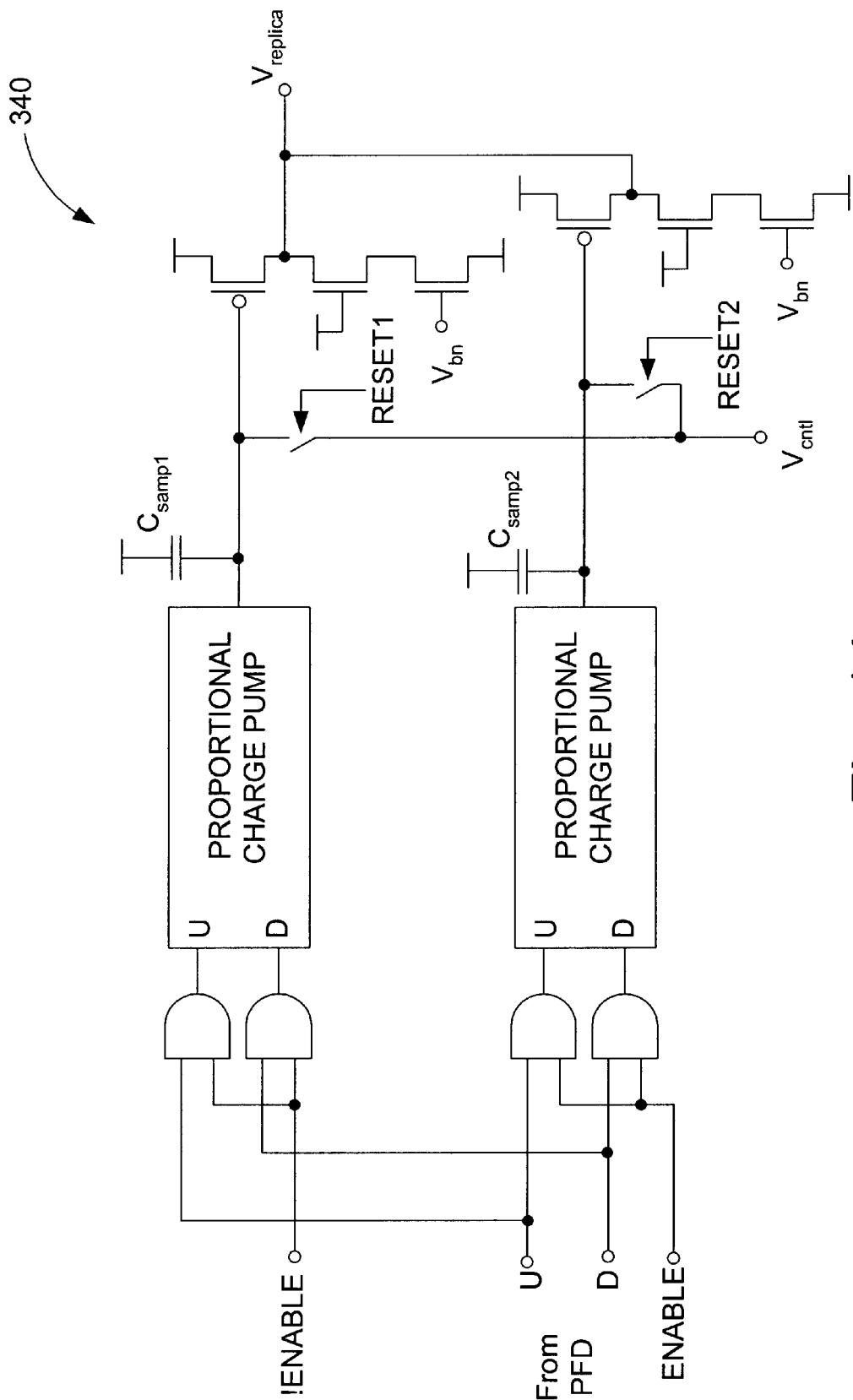
FIG. 14 depicts a charge pump system according to the present invention that is configured to effect proportional and integral control over a PLL output signal via operation of a sampling/switching network provided in the integrating and control paths of the system shown in FIG. 1.

FIG. 14 depicts an alternate charge pump system 340, which includes two proportional charge pumps configured to perform both proportional and integral control without use of a separate integrating charge pump. A separate integrating charge pump is optional because sampling capacitors $C_{samp1}$ and $C_{samp2}$ are reset directly to $V_{cntl}$. Because of this direct coupling to $V_{cntl}$, each proportional charge pump outputs packets of charge which first perform a proportional control function and then an integral control function. The proportional control function occurs prior to reset when the packet of charge has been stored on one of the sampling capacitors. At this point, the packet of charge contributes to the injection of current into the $V_{replica}$ node of bias generator 24, and thus provides proportional control. Upon reset, the residual charge is dumped directly into $V_{cntl}$ and stored on capacitor 42 (FIG. 3) to provide integrating control.

Eliminating the need for a separate integrating charge pump may provide a number of advantages. Without an integrating charge pump, non-zero proportional pulses resulting from offsets between proportional and integrating charge pumps are eliminated. Such offsets could arise due to device mismatches or if the charge pumps are operating with different currents. Fewer charge pumps also leads to a reduction in supporting circuitry within the PLL system. In addition, any instability associated with the proportional charge pump current being dumped into a $V_{cntl}$ replica is eliminated.

In typical implementations of the charge pump system described, there is no independent control of the currents used to provide integrating and proportional control. However, the capacitors shown in FIG. 14 can be scaled to change the proportional control current independently of the integrating charge pump current. Alternatively, another integrating charge pump, operating at a different current level, could be added to either increase or cancel some of the current into $V_{cntl}$ from sampling capacitors $C_{samp1}$ and $C_{samp2}$.

Figure 15:
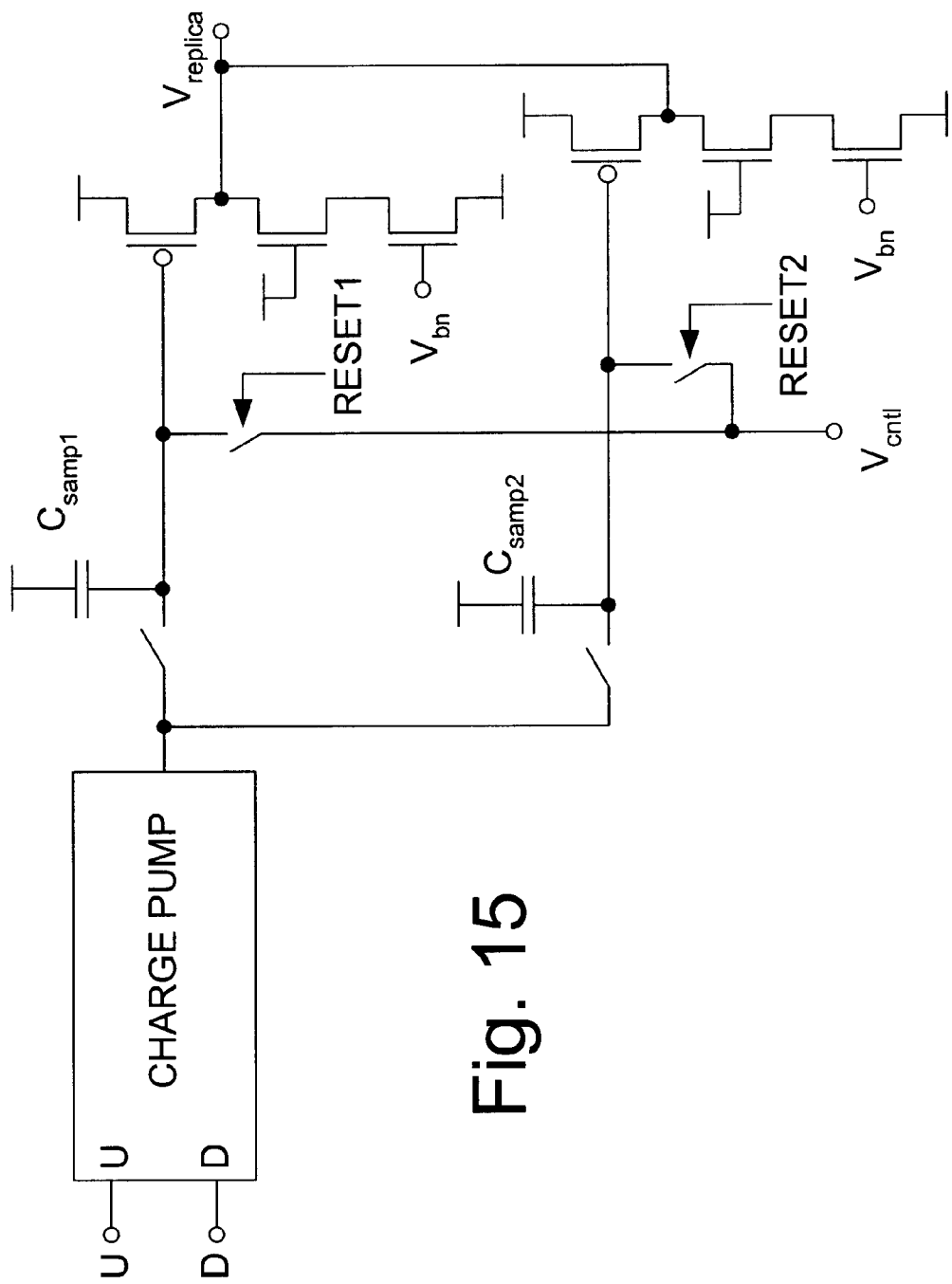
FIG. 15 depicts use of a single charge pump to effect proportional and integral control over a PLL output signal via operation of a sampling/switching network provided in the integrating and control paths of the system shown in FIG. 1.

In some cases, it is advantageous to use a single charge pump. In this case, the output from a single charge pump can be switched to various sampling capacitors to perform the proportional and integral control functions described above, as shown in FIG. 15.

In some phase-locked loop applications, it is useful to scale down the currents emitted from charge pump system 22. This reduces the rate at which the loop can track changes in the reference signal, which may be desired if the PLL is used to filter noise from the reference signal. Charge pump currents may be reduced in a variety of ways, as will be apparent from the examples below. Also, where both integrating and proportional charge pumps are used, it may be desirable to reduce the respective currents by differing amounts, and/or through different current-reducing techniques and structures.

Various current mirror configurations may be employed to reduce charge pump currents and thereby adjust the bandwidth response of the PLL system. For example, the current mirror defined between the current sources of bias generator 24 and charge pump 40 can be configured to create a ratioed mirror. Specifically, charge pump current source transistors 50 and 52 (FIG. 2) may be configured with a width that is some fraction of the width of transistor 86 within bias generator 24 (FIG. 3). The ratio of bias current $I_b$ within the bias generator and the charge pump current $I_{ch}$ is then specified by:

$$I_b/I_{ch} = W_{86}/W_{50},$$

Where $W_{86}$ is the width of transistor 86 and $W_{50}$ is the width of transistor 50. Transistors 50 and 52 typically are the same width in order to balance the charge pump, i.e. $W_{50} = W_{52}$.

Additional current mirrors may be employed to achieve relatively large current reductions without requiring a large range of transistor sizes. For example, as described above with reference to FIG. 5, a current mirror system may be employed to isolate the bias input path of the charge pump system. In addition to, or instead of this bias isolation feature, the mirroring system shown in FIG. 5 may be configured to further scale down the charge pump current. In particular, the current mirror system of FIG. 5 may be configured to include two ratioed mirrors. These two current mirrors, together with the size ratio between transistors 86 and 50, result in a the following ratio between bias current $I_b$ and charge pump current $I_{ch}$:

$$I_b/I_{ch} = (W_{86}/W_{112})(W_{102}/W_{106})(W_{108}/W_{50}).$$

In many cases, it will be preferable to use plural current mirrors cascaded in this manner to achieve larger current reductions.

Figure 16:
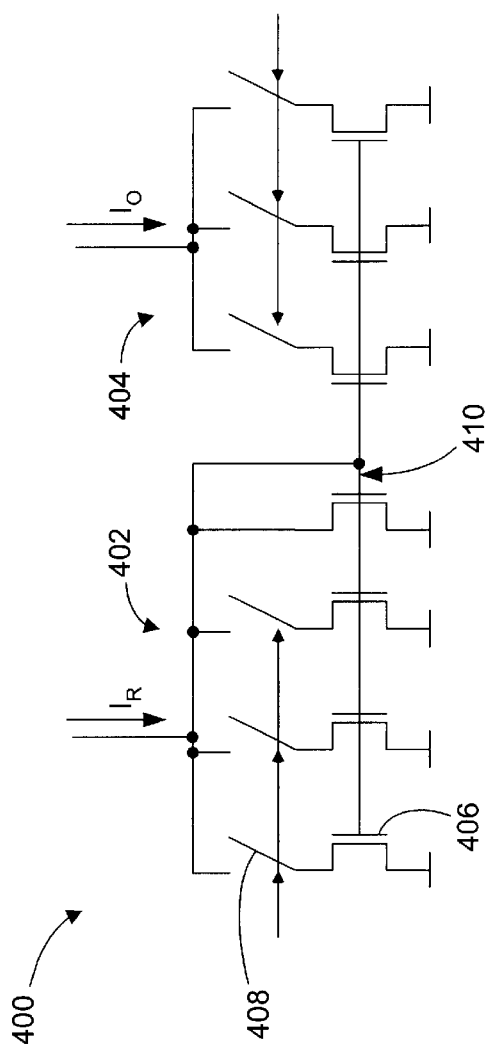

The current mirroring functions described above may be implemented with a programmable current mirror. An illustrative example of such a programmable current mirror is depicted at 400 in FIG. 16.

As indicated, programmable current mirror 400 includes a reference side 402 and a mirror side 404. Mirror side 404 outputs an output current $I_O$ based on a reference current $I_R$ applied to reference side 402. Current mirror 400 is configured to programmably vary a mirroring parameter M which defines the ratio relationship between the reference current and the output current. In particular, the relationship between the reference current, output current and mirroring parameter is defined by the equation $I_O = M \cdot I_R$. As will be appreciated from the following description, mirroring parameter M may be an integer or a rational number.

Either or both sides of programmable current mirror 400 may include one or more switchable current conducting legs couple in parallel, with each leg having a transistor 406 that is selectively activated via operation of a switch 408. Activating and deactivating the various transistor legs on the reference side varies the effective width-to-length ratio of the reference transistors, which in turn leads to variation of the voltage at node 410. This node voltage controls the biasing conditions which determine the current produced on output side 404 of programmable current mirror 400. As indicated, the output side may similarly include multiple switchable legs, to provide control over the effective width-to-length ratio of the output transistors. In the depicted arrangement, the mirroring parameter M is specified by $M = W_O/W_R$, such that $I_O = W_O/W_R \cdot I_R$, where $W_O$ is the effective width-to-length ratio of the activated output transistors, and $W_R$ is the effective width-to-length ratio of the activated reference transistors.

Switching typically is achieved via application of a control word to control the state of the various switches, using digital encoding, thermometer encoding, or other appropriate techniques. The individual transistors may be of the same size, may have sizes that are binary-scaled, or may have other relative dimensions as appropriate to a given setting.

Figure 19:
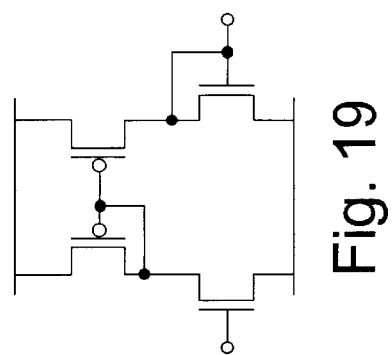
FIGS. 16–19 depict current mirror configurations according to the present invention that may be used to scale charge pump currents occurring in the system shown in FIG. 1.
Figure 18:
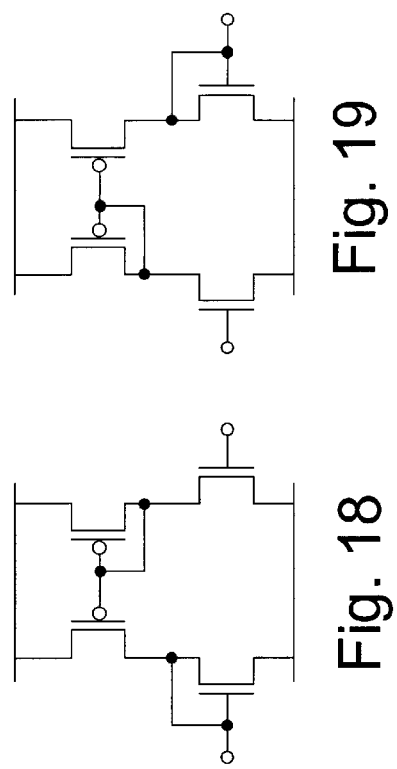
Figure 17:
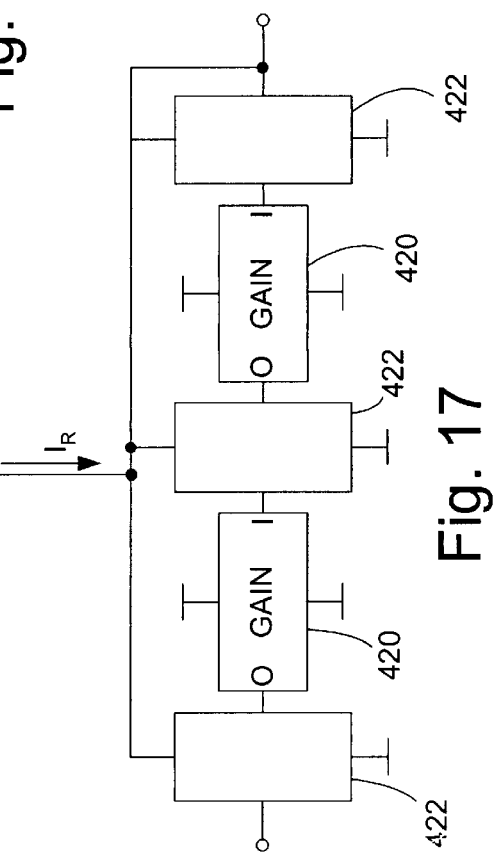

In addition, either or both sides of programmable current mirror 400 may include gain blocks to provide the programmable current mirror with a multistage configuration. For example, FIG. 17 schematically depicts gain blocks 420 coupled with current blocks 422 on the reference side of a programmable current mirror. Each current block 422 includes one or more current conducting legs as described above with reference to FIG. 16. Typically, each current block 422 will include a number of switchable current legs. Gain blocks 420 are interposed between the current blocks, and typically include a fixed current mirror. For a given current block 422 (e.g., a transistor or group of transistors that are selectively activated as described above), the connected gain block 420 is configured to reduce gate voltages for the current block, in order to scale down the effect upon the mirroring parameter produced by switching operations occurring at the current block. FIGS. 18 and 19 depict exemplary embodiments of fixed current mirrors that may be implemented to provide gain between the current block stages. Specifically, FIG. 18 depicts a fixed current mirror that may be used to provide a gain reducing feature between current blocks on the reference side of programmable current mirror 400, while FIG. 19 depicts a fixed current mirror that may be used to reduce gain between stages on the output (mirror) side of the programmable current mirror.

From the above, it should be appreciated that programmable current mirror may be implemented with programmable capability on the reference side, the output side, or both. Further, either or both sides may be implemented with a multistage configuration, though use of gain blocks 420. When the reference side only is provided with programmable capability, the resulting configuration may be referred to as an inverse programmable current mirror, due to the fact that switching operations affect the denominator of mirroring parameter M. Where the output side only is programmable, the configuration is referred to simply as a programmable current mirror, because switching operations affect the numerator of the mirroring parameter M. Where both sides include programmable capability, the current mirror may be considered a rational programmable current mirror. The transistor legs and switching controls may also be implemented so that incrementing the control word produces linear variation in the numerator and/or denominator of the mirroring parameter. Linear variation in the denominator is referred to as inverse-linear programmability.

Typically, as described above, the programmable current mirror may be employed in connection with the circuits used to isolate the bias input path of the charge pump system. For example, a programmable current mirror as described above may be used to create a ratioed mirror between transistor 112 (FIG. 5) and transistor 50 (FIG. 2).

Additionally, or alternatively, a programmable current mirror may be employed within the proportional control path defined between the charge pump system and the $V_{replica}$ node of bias generator 24. Where a programmable current mirror such as that described above is interposed in the proportional control path, the current mirror provides high-resolution control over the scale factor between the current output from the proportional charge pump and the current that is ultimately injected into the bias generator at the $V_{replica}$ node. Use of a programmable current mirror has the advantage of making the PLL loop bandwidth programmable during operation, rather than being a parameter fixed at design time.

Further examples of programmable current mirrors that may be used with the present invention are disclosed in above-referenced co-pending U.S. patent application Ser. No. 10/059,912, by John G. Maneatis, entitled "Programmable Current Mirror," filed on Jan. 28, 2002.

Instead of, or in combination with, the above techniques and structures for reducing charge pump currents, the PLL systems of the present invention may be configured to reduce the number of charge pulses produced by charge pump system 22. These configurations may be employed to reduce output pulses in both the proportional and integrating control paths of the charge pump output, though the method has proved particularly advantageous when applied to integrating charge pump 40.

Figure 20:
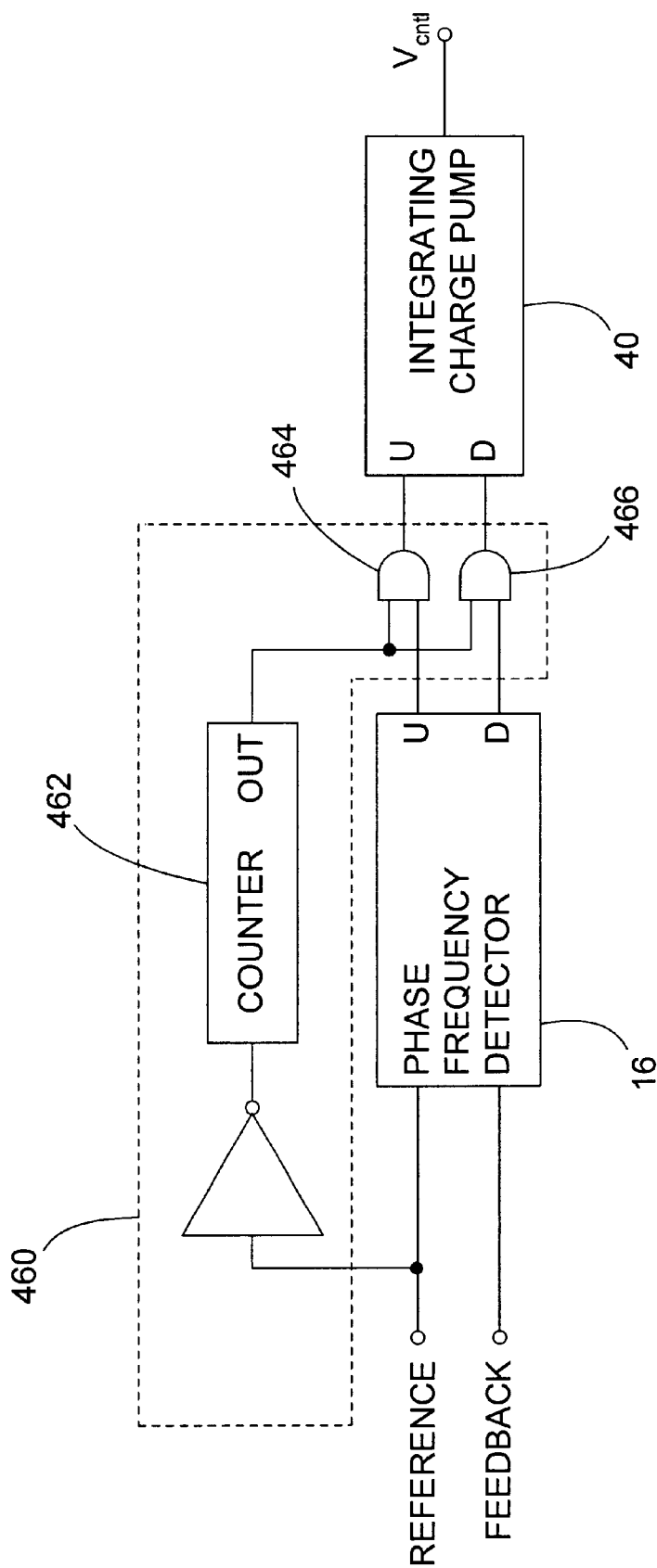
FIG. 20 depicts a gating mechanism according to the present invention for reducing charge pump currents occurring in the system shown in FIG. 1.

FIG. 20 depicts a gating mechanism 460 coupled with phase frequency detector 16 and integrating charge pump 40. As indicated, gating mechanism includes an N-counter 462 connected to the reference line, and gates 464 and 466 coupled in the U and D signal paths between phase frequency detector 16 and integrating charge pump 40. Counter 462 includes a carry output that pulses true once for every N reference cycles, such that the frequency of the error signals (e.g., U and D signals 18 and 20) applied to the integrating charge pump inputs is reduced by a factor of N. This effectively reduces the integrating charge pump current to 1/N of what it would be absent operation of gating mechanism 460.

The reference input to counter 462 can be simply connected to the complement of the reference signal as shown. In some applications, the duty cycle of the reference signal may be relatively uncontrolled, such that the falling edges of the reference signal overlap with the U and D pulses. This may be remedied through use of other clock signals. For example, the counter's clock may be generated from the NAND of the U and D signals or directly from the reset signal contained inside the phase frequency detector that is used to reset the U and D outputs.

The loop bandwidth and multiplication factor N can be adjusted in a PLL design while keeping the loop dynamics constant by appropriately adjusting the charge pump currents. In order to keep the bandwidth to reference frequency ratio and the damping factor constant with changes in N, the integrating charge pump current must be reduced by the factor N and the proportional charge pump current must be held constant. Alternatively, with a fixed N, the damping factor can be held constant while the loop bandwidth is reduced by a factor R if the integrating charge pump current is reduced by the factor $R^2$ and the proportional charge pump current is reduced by the factor R.

While the present invention has been particularly shown and described with reference to the foregoing preferred embodiments, those skilled in the art will understand that many variations may be made therein without departing from the spirit and scope of the invention as defined in the following claims. In particular, the circuits and methods discussed above may be implemented in connection with any family of charge pump, bias generator and VCO circuits. The description of the invention should be understood to include all novel and non-obvious combinations of elements described herein, and claims may be presented in this or a later application to any novel and non-obvious combination of these elements. Where the claims recite "a" or "a first" element or the equivalent thereof, such claims should be understood to include incorporation of one or more such elements, neither requiring nor excluding two or more such elements.

I claim:

1. A phase-locked loop system configured to cause an output signal to tend toward a desired output frequency, the desired output frequency being a factor of a reference frequency associated with an applied reference signal, comprising:

a charge pump system configured to produce a charge pump output based on differences detected between the output signal and the desired output frequency; and an oscillator operatively coupled with the charge pump system and configured to produce the output signal based on the charge pump output, where the charge pump system is configured to selectively effect proportional control over the output signal by applying a correcting pulse along a proportional control path of the phase-locked loop system, and where the charge pump system includes a correction circuit configured to receive the correcting pulse and produce a plurality of smaller correcting pulses to reduce jitter in the output signal.

2. The phase-locked loop system of claim 1, where the correcting circuit includes a sampling capacitance and an output capacitance, the correcting circuit being configured so that the sampling capacitance accumulates a charge corresponding to the correcting pulse and then repeatedly dumps such charge to the output capacitance to produce the smaller correcting pulses.

3. The phase-locked loop system of claim 2, where the correcting circuit is configured so that periodic dumping of the charge on the sampling capacitance is timed with cycles of the output signal.

4. The phase-locked loop system of claim 2, where the sampling capacitance is repeatedly reset according to a timing determined by cycles of the reference signal.

5. The phase-locked loop system of claim 2, where the sampling capacitance and output capacitance are scaled relative to one another according to a frequency relationship between the reference signal and the output signal.

6. The phase-locked loop system of claim 5, where the sampling capacitance is x/y times greater than the output capacitance, where x/y is the factor by which the phase-locked loop system is configured to multiply the reference frequency to produce the desired output frequency.

7. The phase-locked loop system of claim 2, where the sampling capacitance and output capacitance are configured so that the correction circuit outputs substantially as much charge as it receives.

8. The phase-locked loop system of claim 1, where the correcting circuit is configured to produce a smaller correcting pulse for each cycle of the output signal.

9. The phase-locked loop system of claim 1, where the charge pump system includes an individual charge pump configured to provide both integrating and proportional control over the output signal via operation of a switched filter network, where the switched filter network is coupled to the charge pump within the proportional control path and within an integrating control path of the phase-locked loop system.

10. A phase-locked loop system configured to cause an output signal to tend toward a desired output frequency, the desired output frequency being a factor of a reference frequency associated with an applied reference signal, comprising:

a charge pump system configured to produce a charge pump output based on differences detected between the output signal and the desired output frequency; and
  an oscillator operatively coupled with the charge pump system and configured to produce the output signal based on the charge pump output,
    where the charge pump system is configured to selectively effect proportional control over the output signal by producing a correcting pulse having a duration, and applying the correcting pulse to a proportional control path of the phase-locked loop system,
    and where the charge pump system includes a correction circuit configured to receive the correcting pulse and convert the correcting current pulse into a charge-equivalent current that is output over a period of time that is greater than the duration of the correcting pulse.

11. The phase-locked loop system of claim 10, where the charge pump system includes an individual charge pump configured to provide both integrating and proportional control over the output signal via operation of a switched filter network, where the switched filter network is coupled to the charge pump within the proportional control path and within an integrating control path of the phase-locked loop system.

12. The phase-locked loop system of claim 10, where the charge-equivalent current is substantially constant during a plurality of cycles of the output signal.

13. The phase-locked loop system of claim 12, where the charge-equivalent current is substantially constant during a number of cycles of the output signal that substantially corresponds in duration to one cycle of the reference signal.

14. The phase-locked loop system of claim 10, where the correction circuit includes a sampling capacitance configured to store a charge corresponding to the correcting pulse, and where such charge is applied to a voltage controlled current source to produce the charge-equivalent current.

15. The phase-locked loop system of claim 14, where the voltage controlled current source has an associated gain value, the associated gain value being selected based on a ratio of the reference frequency to the desired output frequency.

16. The phase-locked loop system of claim 10, where the correction circuit is one of a plurality of correction circuits with staggered duty cycles, the correction circuits being configured so that one of the correction circuits produces a charge-equivalent current corresponding to a first correcting pulse while another correction circuit resets and waits for a second correcting pulse.

17. The phase-locked loop system of claim 10, where the correction circuit is part of a switched filter network configured to provide both integrating and proportional control over the output signal.

18. The phase-locked loop system of claim 17, where the correction circuit includes a sampling capacitance configured to receive the correcting pulse and store a charge corresponding to the correcting pulse, the switched filter network being configured to first apply such charge to a proportional control path of the phase-locked loop system, and then apply at least a portion of such charge to an integrating control path of the phase-locked loop system.

19. A phase-locked loop system configured to cause an output signal to tend toward a desired output frequency, the desired output frequency being a factor of a reference frequency associated with an applied reference signal, comprising:

a charge pump system configured to produce a charge pump output based on differences detected between the output signal and the desired output frequency; and
  an oscillator operatively coupled with the charge pump system and configured to produce the output signal based on the charge pump output,
    where the charge pump system is configured to selectively effect proportional control over the output signal by producing a correcting pulse having a duration and applying the correcting pulse to a proportional control path of the phase-locked loop system,
    and where the charge pump system includes a correcting circuit having a sampling capacitance configured to receive the correcting pulse and store a corresponding correcting charge, the correcting circuit being configured to output the correcting charge over a period of time that is greater than the duration of the correcting pulse.

20. The phase-locked loop system of claim 19, where the correcting circuit further includes an output capacitance, the correcting circuit being configured so that the sampling capacitance repeatedly dumps the correcting charge to the output capacitance to produce a plurality of smaller correcting pulses corresponding to the correcting pulse.

21. The phase-locked loop system of claim 20, where the correcting circuit is configured so that periodic dumping of the charge on the sampling capacitance is timed with cycles of the output signal.

22. The phase-locked loop system of claim 20, where the sampling capacitance is repeatedly reset according to a timing determined by cycles of the reference signal.

23. The phase-locked loop system of claim 20, where the sampling capacitance and output capacitance are scaled relative to one another according to a frequency relationship between the reference signal and the output signal.

24. The phase-locked loop system of claim 23, where the sampling capacitance is x/y times greater than the output capacitance, where x/y is the factor by which the phase-locked loop system is configured to multiply the reference frequency to produce the desired output frequency.

25. The phase-locked loop system of claim 20, where the sampling capacitance and output capacitance are configured so that the correction circuit outputs substantially as much charge as it receives.

26. The phase-locked loop system of claim 20, where the correcting circuit is configured to produce a smaller correcting pulse for each cycle of the output signal.

27. The phase-locked loop system of claim 19, where the charge pump system includes an individual charge pump configured to provide both integrating and proportional control over the output signal via operation of a switched filter network associated with the correction circuit, where the switched filter network is coupled to the charge pump within the proportional control path and within an integrating control path of the phase-locked loop system.

28. The phase-locked loop system of claim 19, where the correction circuit is configured to output a charge-equivalent current based on the correcting pulse and corresponding correcting charge.

29. The phase-locked loop system of claim 28, where the charge-equivalent current is substantially constant during a plurality of cycles of the output signal.

30. The phase-locked loop system of claim 29, where the charge-equivalent current is substantially constant during a number of cycles of the output signal that substantially corresponds in duration to one cycle of the reference signal.

31. The phase-locked loop system of claim 28, where the correction circuit is configured to apply the correcting charge to a voltage controlled current source to produce the charge-equivalent current.

32. The phase-locked loop system of claim 31, where the voltage controlled current source has an associated gain value, the associated gain value being selected based on a ratio of the reference frequency to the desired output frequency.

33. The phase-locked loop system of claim 28, where the correction circuit is one of a plurality of correction circuits with staggered duty cycles, the correction circuits being configured so that one of the correction circuits produces a charge-equivalent current corresponding to a first correcting pulse while another correction circuit resets and waits for a second correcting pulse.

34. A method of reducing jitter in a phase-locked loop system configured to produce an output signal having an output frequency which is a factor of a reference frequency associated with an applied reference signal, the method comprising:
 receiving a correcting pulse from a charge pump system configured to selectively effect proportional control over the output signal by producing such a correcting pulse and applying the correcting pulse to a proportional control path of the phase-locked loop system, where the received correcting pulse has a duration;
 storing a correcting charge based on the correcting pulse at a sampling capacitance; and
 outputting the correcting charge to control an oscillator which generates the output signal, where the outputting of the correcting charge occurs over a period of time that is greater than the duration of the correcting pulse.

35. The method of claim 34, further comprising providing integrating and proportional control over the output signal based on output from a single charge pump included with the charge pump system.

36. The method of claim 34, where outputting the correcting charge includes outputting a plurality of smaller correcting pulses corresponding to the received correcting pulse.

37. The method of claim 36, where outputting the correcting charge includes repeatedly dumping charge from the sampling capacitance to an output capacitance to produce the plurality of smaller correcting pulses.

38. The method of claim 36, where the output frequency is N times the reference frequency, and where outputting a plurality of smaller correcting pulses includes outputting N smaller correcting pulses for each received correcting pulse.

39. The method of claim 34, where outputting the correcting charge includes outputting a portion of the correcting charge during each of a plurality of cycles of the output signal.

40. The method of claim 34, where outputting the correcting charge includes outputting a charge-equivalent current corresponding to the correcting pulse.

41. The method of claim 40, where the charge-equivalent current is output over substantially all of one cycle of the reference signal.

42. The method of claim 34, where outputting the correcting charge includes outputting a plurality of smaller correcting pulses corresponding to the correcting pulse, where the smaller correcting pulses are output at a correction frequency that is greater than a receive frequency associated with the correcting pulse.

43. A phase-locked loop configured to produce an output signal based on an applied reference signal, comprising:
 a charge pump system operatively coupled with an error detector and configured to produce a charge pump output; and
 a voltage controlled oscillator operatively coupled with the charge pump system and configured to produce the output signal based on the charge pump output,
 where the charge pump output includes a charge pump current that is scalable via selective operation of an inverse programmable current mirror in order to vary bandwidth response of the phase-locked loop.

44. The phase-locked loop of claim 43, where the inverse programmable current mirror is provided with a multistage configuration.

45. The phase-locked loop of claim 43, where the inverse programmable current mirror includes:
 a reference system configured to receive a dynamic biasing signal; and
 a mirror system operatively connected to the reference system and configured to output a scaled copy of the dynamic biasing signal, where the scaled copy of the dynamic biasing signal is scaled down by a mirror factor and applied to bias a charge pump within the charge pump system,
 where the reference system includes a plurality of transistor groups, each transistor group being configured to alter the mirror factor via programmable variation of a dimensional parameter associated with the transistor group,
 and where alterations to the mirror factor produced by one of the transistor groups are scaled relative to alterations produced by another of the transistor groups.

46. A phase-locked loop configured to produce an output signal based on an applied reference signal, comprising:

an error detector configured to produce an error signal for each cycle of the reference signal;

a charge pump operatively coupled to the error detector and configured to produce a charge pump output based on error signals generated at the error detector;

an oscillator operatively coupled with the charge pump and configured to produce the output signal based on the charge pump output; and a gating system coupled between the error detector and charge pump, the gating system being configured to quantitatively reduce the charge pump output by gating the error signals generated by the error detector so that only a portion of the error signals are applied to the charge pump.

* * * * *